(12) United States Patent
Aoki et al.

(10) Patent No.: US 7,018,858 B2
(45) Date of Patent: Mar. 28, 2006

(54) LIGHT ABSORBING LAYER PRODUCING METHOD

(75) Inventors: Satoshi Aoki, Sayama (JP); Masako Kimura, Sayama (JP); Masanori Kosugi, Minato-ku (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/871,450

(22) Filed: Jun. 18, 2004

(65) Prior Publication Data
US 2005/0028861 A1 Feb. 10, 2005

(30) Foreign Application Priority Data
Jan. 28, 2003 (WO) .................. PCT/JP03/00792

(51) Int. Cl.
*H01L 21/00* (2006.01)
(52) U.S. Cl. ............................ 438/22; 438/584
(58) Field of Classification Search ............ 438/22, 438/95, 584, 605, 608, 609
See application file for complete search history.

(56) References Cited

U.S. PATENT DOCUMENTS

| | | | |
|---|---|---|---|
| 4,798,660 A | 1/1989 | Ermer et al. ........... 204/192.17 |
| 4,945,079 A * | 7/1990 | Pedersen et al. ............ 502/314 |
| 5,422,304 A | 6/1995 | Kohiki et al. ............... 437/105 |
| 5,626,688 A * | 5/1997 | Probst et al. ............... 136/265 |
| 6,346,184 B1 * | 2/2002 | Sano et al. ................. 205/199 |
| 6,802,953 B1 * | 10/2004 | Sano et al. ................. 205/333 |
| 6,881,058 B1 * | 4/2005 | Kawano et al. ............. 432/152 |

FOREIGN PATENT DOCUMENTS

| JP | 8-222750 | 8/1996 |
|---|---|---|
| JP | 10-135495 | 5/1998 |

OTHER PUBLICATIONS

"Growth of Cu(In,Ga) Se2 Thin Films by Coevaporation Using Alkaline Precursors", Marika Bodeg Ard et al, Thin Solid Films 2000, 361-362.
"Influence of Substrates on the Electrical Properties of Cu(InGa) Se2 Thin Films", Ruckh et al., IEEE 1994, Dec. 5-9.

* cited by examiner

Primary Examiner—Phuc T. Dang
(74) Attorney, Agent, or Firm—Fulbright & Jaworski LLP

(57) ABSTRACT

A method of producing a light absorbing layer of CIGS for a solar cell by forming a precursor film on a back electrode and treating the precursor film in a selenium atmosphere, wherein an alkali layer is formed on the back electrode by dipping the back electrode in an aqueous solution containing alkali metals and drying and then a laminated precursor is formed on the alkali layer. By applying this method, the alkali layer whose components of Ia-group elements are diffused into the light absorbing layer to improve power conversion efficiency thereof can be easily formed with no fear of denaturing the back electrode and peeling of the layer at the boundary between the light absorbing layer and the back electrode.

12 Claims, 11 Drawing Sheets

LIGHT ABSORBING LAYER PRODUCING METHOD

BACKGROUND OF THE INVENTION

The present invention relates to a method of producing a light absorbing layer of a compound semiconductor thin-film solar cell.

FIG. 1 shows a basic structure of a thin-film solar cell manufactured from a general chalcopyrite compound semiconductor, which comprises a SLG (soda lime glass) substrate 1 on which a back molybdenum (Mo) electrode layer (positive electrode) 2, a light absorbing layer 5, a buffer layer 6 (ZnS, Cds, etc.) and a transparent electrode layer (negative electrode) 7 made of ZnO, Al, etc are sequentially formed in the described order.

In the thin-film compound semiconductor solar cell, the light absorbing layer 4 is made in the form of a CIGS (Copper-Indium-Gallium-Selenium) thin film made of Cu(In,Ga)Se2 of Ib-IIIb-VIb2 group (based on Cu, (In,Ga), Se), which possesses high power conversion efficiency exceeding 18%.

There is known a conventional method of producing a light absorbing layer of CIGS, which is called "selenization method" by which a selenium (Se) compound is produced by thermo-chemical reaction of a thin-film metal precursor with Se supplied from a Se-source such as H2Se gas source.

U.S. Pat. No. 4,798,660 discloses a method whereby a thin metal film formed of a metal back-electrode layer, a pure copper (Cu) single layer and a pure indium (In) single layer sequentially deposited by a DC magnetron sputtering method is selenized in a selenium (Se) atmosphere (preferably in H2Se gas) to produce a light absorbing layer having a homogeneous composition of CIGS (copper indium diselenium).

Japanese Laid-Open Patent Publication No. H10-135495 describes a metal precursor which is a thin metal laminate formed by sputtering first with a target of Cu—Ga alloy and then with a target of pure indium. As shown in FIG. 2, a thin firm of CIGS for a light absorbing layer 4 is formed on a Mo electrode layer 2 deposited on a SLG (soda lime glass) substrate 1. Namely, a Cu—Ga metal thin layer 31 is first deposited on the Mo-electrode layer of the substrate by the first sputtering process SPT-1 using the Cu—Ga alloy target and then an In metal thin layer 32 is deposited on the Cu—Ga layer 31 by the second sputtering process SPT-2 using the In target T2 to produce a metal-laminated precursor 3 which is then treated by heat in the presence of Selenium (Se) gas by a heat treatment process HEAT to obtain a light absorbing film 5 in the form of a thin CIGS film.

However, this precursor 3 being a laminate of a Cu—Ga alloy layer 31 and an In layer 32 may be subjected to solid-state (interlayer) diffusion of elements which react with one another to form an alloy Cu—In—Ga at a boundary between the laminated layers both in the process of forming the precursor and in the state of being temporarily stored. This reaction still progresses during the selenization of the precursor. As it is difficult to evenly control the alloying reaction process between samples (requiring control of parameters relating to the alloying reaction, for example, temperature, time, etc), the quality of the light absorbing layers 5 may considerably vary. The aggregation of indium is apt to occur, resulting in uneven composition in the layer.

Therefore, there has been proposed such a solution that the concentration of Ga in the precursor has a gradient of Mo, which may decrease in the direction toward the surface from the boundary with the Mo electrode layer 2. However, the conventional method still involves a problem that elements Ga segregate on the boundary between the Mo electrode layer 2 and the Cu—In—Ga layer, causing insufficient adhesion between the light absorbing layer 5 of CIGS and the Mo electrode layer 3. This may be a cause of degradation of the performance of the solar cell product.

In the literature Thin Solid Films 361–362 (2000), pages 9–16, it was reported that the conventional solar cells using a CuInSe2 film containing Na components diffused from a soda lime glass of a substrate diffused and grown therein could attain higher power conversion efficiency (see M. BodegÅrd et al.: "Growth of Cu(In,Ga)Se2 thin films by coevaporation using alkaline precursors").

In the first World Conference on Photovoltaic Electric Power Conversion ("WCPEC"), there have been reported further findings: a CIGS film deposited on the glass containing Na has a small resistance; a solar cell produced by forming CIGS on a Na2O2 film preformed on a substrate can attain power conversion efficiency improved by about 2% as compared with that of a solar cell manufactured without deposition of a Na2O2 film and its power conversion efficiency that generally depends largely on the Cu-to-In ratio can be constant irrespective of the Cu-to-In ratio (M. Ruckhetal, "Influence of Substrates on the Electrical Properties of Thin film of Cu (In, Gs)Se2", First WCPEC, Dec. 5–9, 1994).

As is apparent from the above reports, the diffusion or addition of Na is effective to promote the growth of the CuInSe2 film, increase the carrier concentration and improve the power conversion efficiency of the solar cell.

Japanese Laid-Open Patent Publication No. H8-222750 discloses as a method of doping Na in the process of selenizing a laminated precursor formed after preparation of a Na layer by sputtering or depositing. The problem with this process is that a layer of Na or Na compound possessing the hydroscopic property may be denatured by exposing to atmosphere, resulting in peeling of the layer in the precursor.

To solve the above problem, U.S. Pat. No. 5,422,304 discloses a deposition method of manufacturing the CuInSe2 film by doping Na together with other elements composing the light absorbing layer. A method of depositing a Cu—In—O:Na2O2 by sputtering on the Mo electrode layer is also disclosed. However, these methods require rather complicated processes.

Thus, in the process of producing a thin film compound semiconductor solar cell by forming a laminated precursor film composed of a Cu—Ga alloy layer and an In layer on a back electrode and treated by heat in a selenium atmosphere to form a CIGS light absorbing layer, the method of improving the power conversion efficiency of the solar cell by diffusing Na in the light absorbing layer involves a problem of peeling of the Na layer by denature.

The doping of Na in the process of selenization and the selenization of the laminated precursor formed on the Cu—In—O;Na2O2 deposited by sputtering on the back electrode have a common problem of complicating the working process.

SUMMARY OF THE INVENTION

Accordingly, an object of the present invention is to provide a method of forming a CIGS light absorbing layer of a thin-film compound semiconductor solar cell by first forming a precursor film on a back electrode and then treating by heat the precursor film in the presence of selenium to produce the thin-film light absorbing layer of CIGS, wherein an alkali layer for diffusing alkali components of Ia group in the light absorbing layer to increase the power conversion efficiency of the solar cell product is formed by a simple process with no fear of occurrence of denature and peeling of the layer, which process comprises dipping of the back electrode in an alkali aqueous solution containing alkali metals and drying of the dipped electrode to form an alkali layer thereon.

PREFERRED EMBODIMENT OF THE INVENTION

Figure 1:
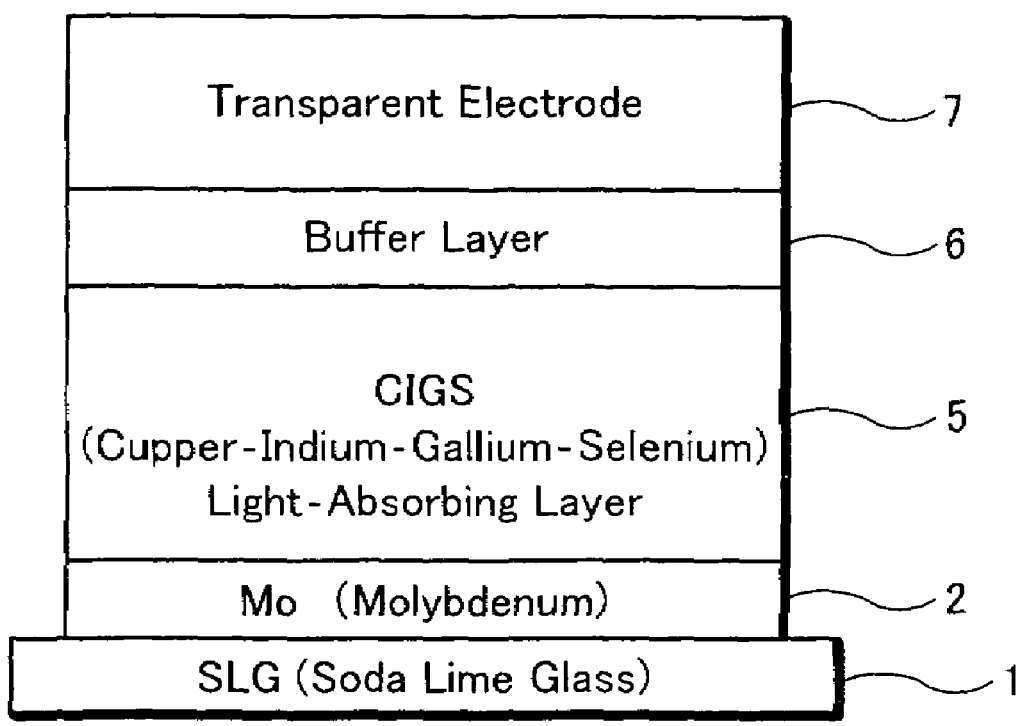
FIG. 1 shows a basic structure of a solar cell of general compound semiconductors in cross section.
Figure 2:
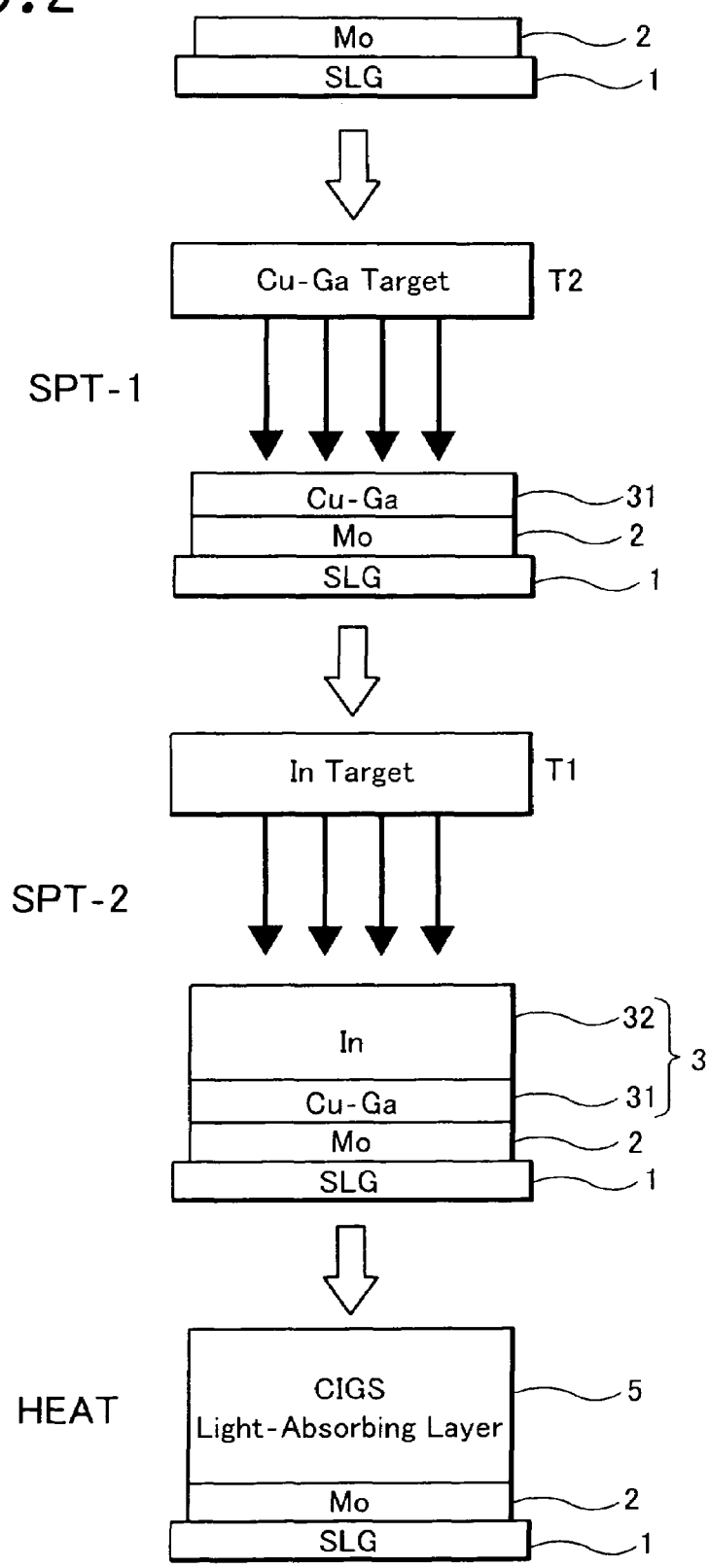
FIG. 2 illustrates a conventional process of producing a light absorbing thin layer on a back electrode.
Figure 3:
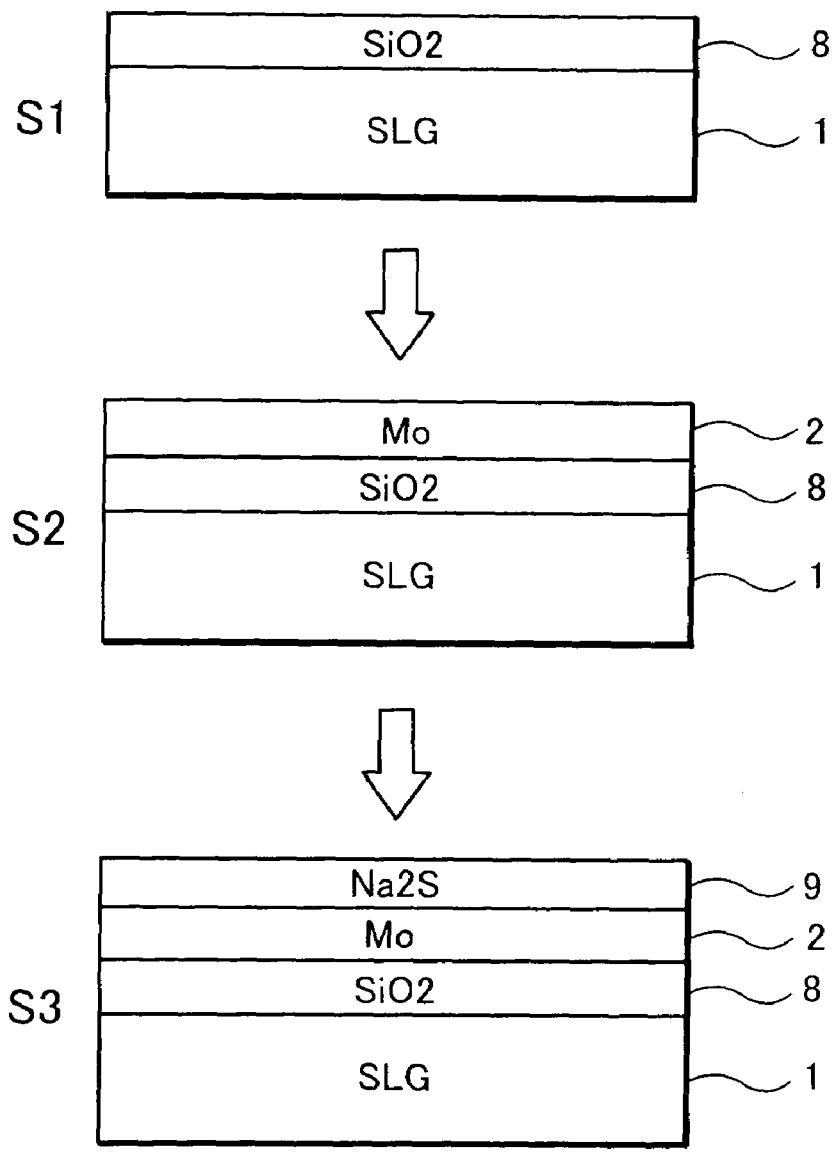
FIG. 3 illustrates a process of producing a light absorbing thin layer according to the present invention, whereby a barrier layer, a back electrode layer and alkali layer are successively formed on a SLG substrate.

As shown in FIG. 3, according to the present invention, a light absorbing layer is fabricated by the following process:

On a SLG (soda lime glass) substrate 1, there is first formed by a CVD method a barrier layer 8 of SiO2 for preventing diffusion of Na components from the substrate (Step S1). A molybdenum (Mo) electrode layer is next formed on the barrier layer 8 by a sputtering method (Step S2) and an alkali layer 9 of Na2S is then formed on the Mo electrode layer 8 by a dipping method (Step S3). In Step S3, the alkali layer 9 is formed for example by dipping the Mo electrode layer 2 formed on the substrate in an aqueous solution prepared by dissolving Na2S.9H2O (sodium sulfide) into pure water in a concentration within 0.1–5 wt %. The dipped layer is spin-dried and treated by baking at 150° C. for 60 minutes in the surrounding air for regulating moisture remaining in the film.

Figure 4:
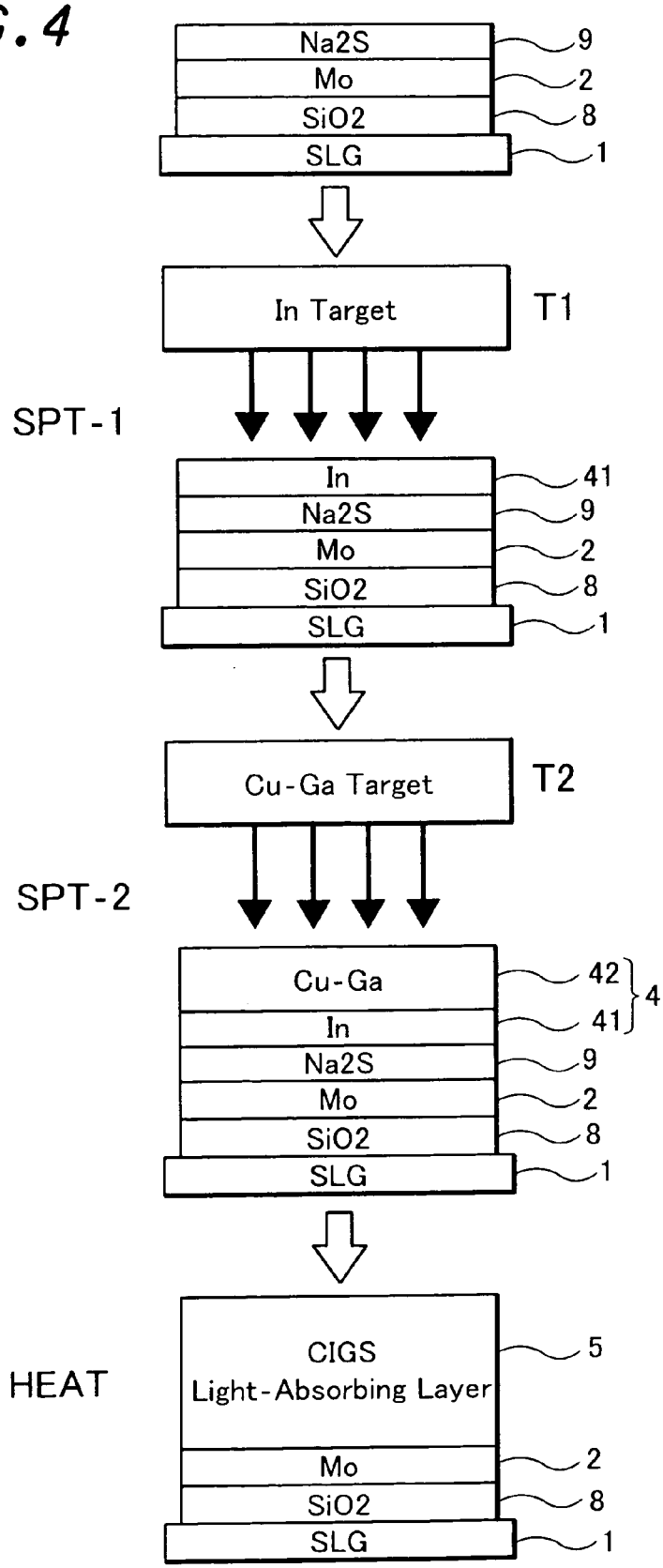
FIG. 4 illustrates a process of producing a light absorbing thin layer by forming a laminated precursor on an alkali layer according to the present invention.

As shown in FIG. 4, an indium (In) layer 41 is formed on the alkali layer 9 by the first sputtering process SPT-1 using a single In target T1 and a copper-gallium (Cu—Ga) alloy layer 42 is formed thereon by the second sputtering process SPT-2 using a Cu—Ga alloy target T2 to form a laminated metal precursor 4 composed of the In layer 41 and the Cu—Ga alloy layer 42, which precursor 4 is then treated by heat in the atmosphere of selenium (Se) to form a thin film light absorbing layer 5 of CIGS.

In this stage, the alkali layer 9 disappeared by diffusing its component Na into the light absorbing layer 5.

Thus, according to the present invention, it is possible to fabricate a light absorbing layer 5 of CIGS thin film having higher power conversion efficiency, which improvement is achieved by effective diffusion of Na of the alkali layer 9 into the laminated precursor 4 in the process of heat treatment thereof in the presence of selenium. It is also possible to easily obtain an alkali layer 9 by a simple process. In addition, the alkali film 9 formed by a wet treatment process on the Mo electrode layer 2 contains moisture and can therefore be free from such troubles that a dry film formed by dry process may absorb moisture from the surrounding air resulting in deterioration and peeling of the layer. The hydration enables the alkali film to keep moisture which content can be regulated by the baking treatment of the precursor. Thus, the formed film has excellent wettability.

The use of aqueous solution of Na2S.9H2O which concentration was adjusted in a range of 11 to 13 pH can effectively remove by etching an oxide coat from the Mo electrode layer 2 and at the same time can improve adhesion between surfaces of the Mo electrode layer 2 and the light absorbing layer 5 by the effect of S component.

Advantages of the dipping process of forming the alkali layer 9 are as follows:

(1) This process can be carried out in a simple apparatus in comparison with a sputtering process and a vacuum depositing process both requiring a large scale apparatus. In the case of using the vacuum apparatus, it is rather difficult to control the quality of a sputtering target and its vacuum evaporation source. In contrast, material Na2S used for this process has high moisture-absorbing ability and therefore its moisture content can be easily controlled in the dipping process.

(2) This process can form an alkali layer 9 best suited to surfaces of the substrate and electrode layer, which have texture suitable to confine the incident light. Other than the Mo electrode layer 2, surfaces of component layers to be dipped in the aqueous solution of Na2S 9H2O may be surfaces of the laminated precursor 4, the light absorbing layer 5 after selenization and the buffer layer formed on the light absorbing layer 5. The dipping process can form alkali layers having excellent molecular-level coverage of extremely rough surfaces of the laminated precursor 4 and light absorbing layer 5.

Dipping the electrode layer 2 in aqueous solution of alkali metal can remove particles and oxide films by etching from the Mo electrode layer 2. As the result of this, it becomes possible to omit the washing process of the surface of the Mo electrode layer after scribing it by a laser beam. The pH of the dipping solution can be easily regulated by adding thereto ammonium or NaOH.

The use of the aqueous dipping solution makes the alkali layer 9 contain therein, besides hydrogen, residual oxygen which is then incorporated into the light absorbing layer 5, thereby improving the semiconductor properties.

According to the present invention, the buffer layer 8 is provided between the SLG substrate 1 and the Mo electrode layer 2, which can effectively prevent diffusion of Na elements into the light absorbing layer 5 from the substrate 1 through the Mo electrode layer 2 in the process of heat treatment of the light absorbing layer. This can prevent the excessive supply of Na into the light absorbing layer 5 and, at the same time, can effectively prevent deterioration of the substrate 1.

The measurement results of deposition amount of Na by forming the alkali layer 9 on the Mo electrode layer 2 are as follows:

Two kinds of samples 1Y16–51 of Na2S diluted to 0.2% and 1Y16-52 of Na2S diluted to 0.8% were used. According to the ICP-MS analyzing method, 6 ml of ultra-pure water is dropped onto a formed film portion of each sample and scanned for about 5 minutes with a solution transferring tool to recover Na. As the result of this, the quantity of Na atoms per unit surface area is determined as 2.8E+15 (atoms/cm$^2$) on the former sample and 8.7E+15 (atoms/cm$^2$) on the latter sample. The limit of determination is about 2E+10.

Figure 5:
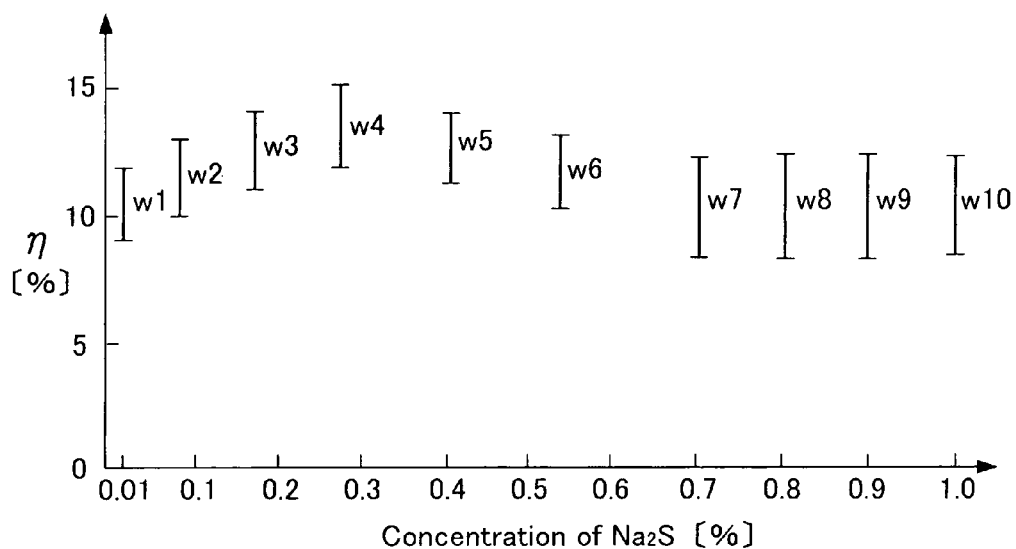
FIG. 5 is a graph showing power conversion efficiency characteristics of light absorbing layers formed by changing the concentration of the aqueous solution of Na2S.

FIG. 5 is a graph showing the results of measurements of power conversion efficiency η (%)(S=0.16) of light absorbing layers fabricated by changing concentration of the aqueous solution of Na2S, where ranges of measurements on a plurality of samples are shown as w1, w2, w3, . . . .

As shown in FIG. 5, concentrations of the aqueous solution of Na2S are suitable in the range of 0.01 to 1.0(5) from the view point of the power conversion efficiency η. The power conversion efficiency η of the product is decreased with the smaller concentration of the aqueous solution of Na2S. On the contrary, the use of the solution of excessively high concentration of Na2S may cause peeling of a layer part by etching at the boundary between the Mo electrode layer 2 and the SLG substrate 1.

Figure 6:
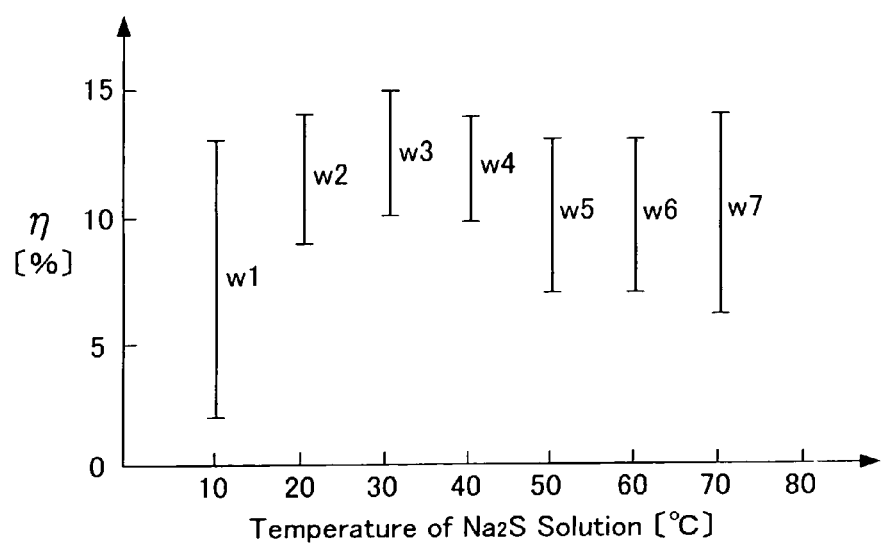
FIG. 6 is a graph showing the results of measurements of power conversion efficiency characteristics of light absorbing layers formed by changing the temperature of the aqueous solution of Na2S.

FIG. 6 is a graph showing the results of measurements of power conversion efficiency η (%)(S=0.16) of light absorbing layers 5 fabricated by changing temperature of the aqueous solution of Na2S (at Na2S concentration of 0.27%).

As shown in FIG. 6, the working temperature of the aqueous solution of Na2S is suitable in a range of 10° C. to 70° C. (preferably in the range of 15° C. to 40° C.) from the view point of the power conversion efficiency η. In this case, dipping in the solution at lower temperature may cause decreasing of the power conversion efficiency η of the product while dipping in the solution at temperature of 80° C. or higher may cause may cause peeling of a layer part by etching at the boundary between the Mo electrode layer 2 and the SLG substrate 1.

Figure 7:
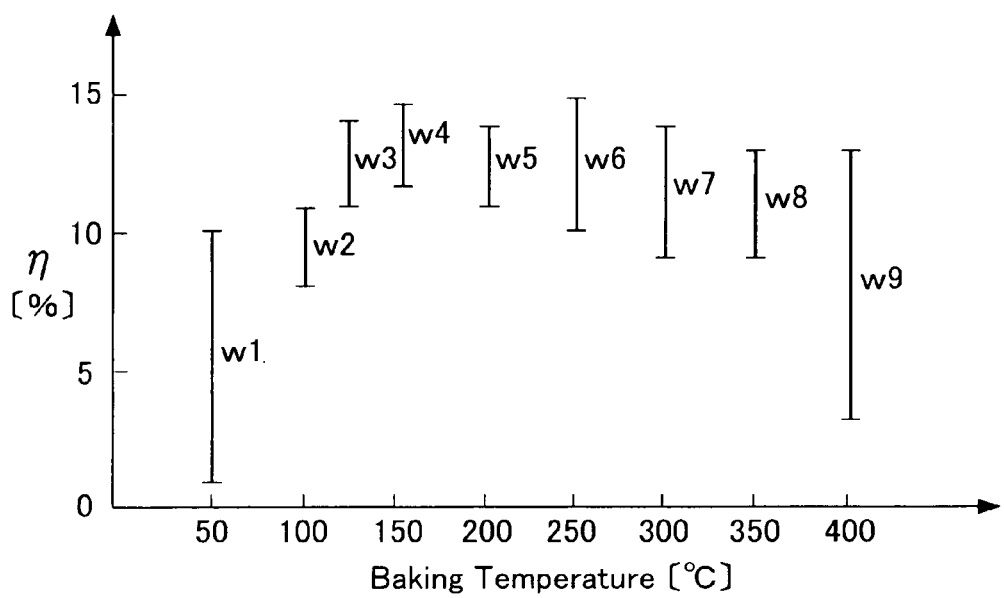
FIG. 7 is a graph showing the results of measurements of power conversion efficiency characteristics of light absorbing layers formed by changing the temperature of the baking treatment of an alkali layer.

FIG. 7 is a graph showing the results of measurements of power conversion efficiency η (%)(S=0.16) of light absorbing layers fabricated by changing the temperature of baking treatment (for 60 minutes) of an alkali layer 9. As shown in FIG. 7, the baking treatment temperature is suitable in the range of 100° C. to 400° C. (preferably in the range of 100° C. to 250° C.) from the view point of the power conversion efficiency η. In this case, baking treatment at a lower temperature may cause decreasing of the power conversion efficiency η of the product while baking treatment at a higher temperature may cause may decrease moisture in the Mo electrode layer 2 which in this case may peel off.

Figure 8:
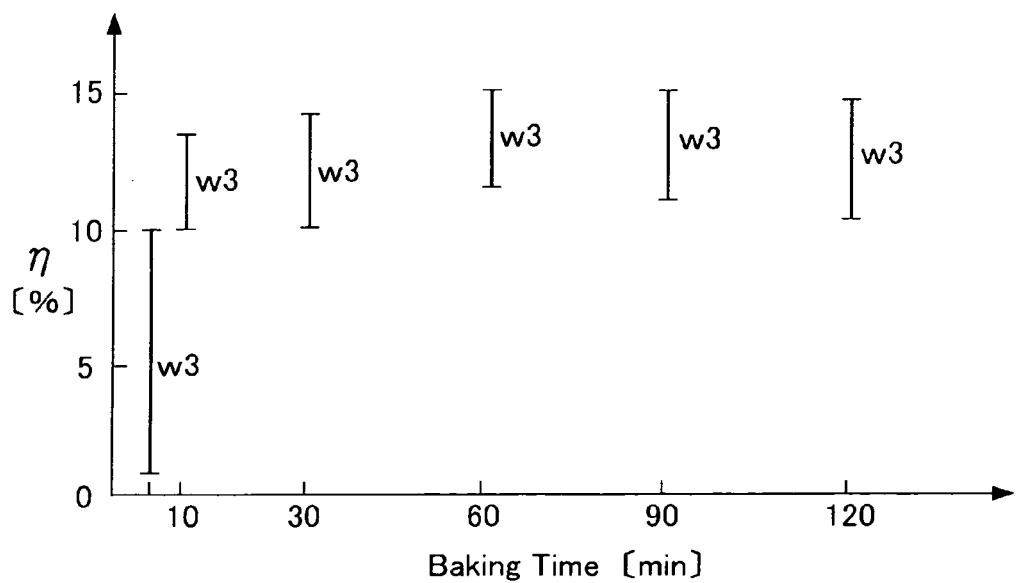
FIG. 8 is a graph showing the results of measurements of power conversion efficiency characteristics of light absorbing layers formed by changing the time of the baking treatment of an alkali layer.

FIG. 8 is a graph showing the results of measurements of power conversion efficiency η (%)(S=0.16) of light absorbing layers fabricated by changing time of baking treatment at 150° C. of an alkali layer.

The measurement results indicate that the baking treatment time is suitable within 10–60 minutes from the view point of securing the power conversion efficiency η and working condition.

According to the present invention, for forming the alkali layer by dipping in an aqueous solution containing elements of Ia group, it is possible to use aqueous solutions of alkali metals other than the hydrate of Na2S.9H2O or aqueous solutions of sulfide or hydride or chloride of the other alkali metals. In practice, the following aqueous solutions can be used.

Na compounds: Na2SeO3.5H2O, Na2TeO3.5H2O, Na2SO3.7H2O, Na2B4O7.10H2O, AlNa(SO4) 2.12H2O and NaCl.

K compounds: K2TeO3.3H2O, K2Al2O4.3H2O, A1K (SO4)2.12H2O, KOH, KF, K2SeO3, K2TeO3, KCL, K2[CuC14(H2O)2], KBr, KBH4, K2S2O3.nH2O, K2S2O5, K2S2O7, KF.2H2O, KF.HF, K2TiF6, K2B4O7.4H2O, KHSO4 and KI.

Li compounds: Li2B4O7.3H2O, Li2B4O7, LiCl, LiBr, LiBr.H2O, LiOH, LiOH.H$_2$O, LiF and Li2SO4.H2O.

According to the present invention, a laminated precursor 4 is fabricated by successively forming an In layer 41 and a Cu—Ga alloy layer 42 formed first on a Mo electrode layer 2, thereby preventing the formation of an alloy of elements Cu slowly diffused and segregated in solid phase at a boundary between the precursor and the Mo electrode layer 2. This can also facilitate In component to sufficiently diffuse in the precursor on the Mo electrode layer side in the process of selenizing the laminated precursor 4 by heating in the selenium atmosphere, simultaneously preventing slowly diffusing elements Ga from segregating at the boundary of the Mo electrode layer 2 and forming thereat a different alloy layer of Cu—Ga—Se which is inferior in its crystal structure. The CIGS light absorbing layer 5 thus fabricated can possess high quality P-type semiconductor structure featured by the homogeneous crystal structure of Cu(In+Ga)Se.

According to the present invention, it is possible to produce a solar cell which is featured by high performance and high strength of adhesion between the Mo electrode layer 2 and the light absorbing layer 5 and which is free from the formation of a strange layer (Cu—Ga—Se layer) having inferior crystal structure and possessing conductivity.

Figure 9:
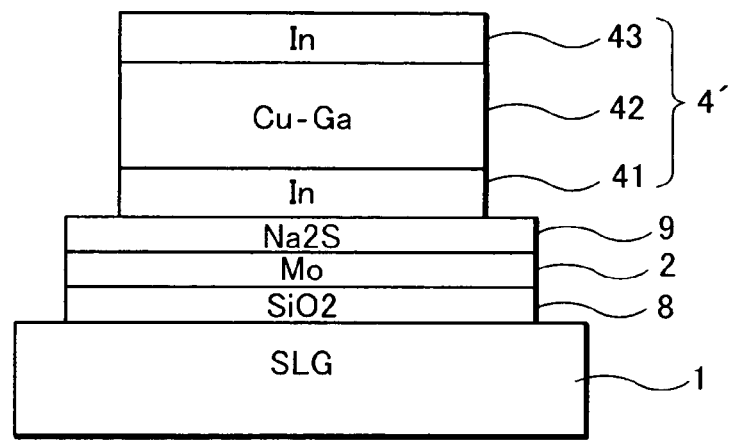
FIG. 9 is a front sectional view of a laminated precursor having a Cu—Ga alloy layer sandwiched between In layers on an alkali layer.

FIG. 9 illustrates a laminated precursor 4' according to the present invention, which has a Cu—Ga alloy layer 42 sandwiched between two In layers 41 and 43 and which is formed by sputtering on an alkali layer 9 of Na2S formed on a Mo electrode layer 2. Since the Cu—Ga alloy layer 42 is deposited on the In layer 41 formed in advance on the Mo electrode layer 2, there is no fear of forming of an alloy layer of elements diffused in solid layer at the boundary of the Mo electrode layer 2. This structure attains effective diffusion of In-elements in the precursor on the Mo electrode layer side in the process of selenizing the precursor 4' in a selenium (Se) atmosphere, simultaneously eliminating the possibility of segregation of slow diffusing elements Ga at a boundary of the Mo electrode layer and formation thereat of a different alloy layer of Cu—Ga—Se which may have inferior crystal structure. The precursor is covered at its top surface with the In layer 43 which eliminates the possibility of forming an alloy of Cu2Se on the surface of the light absorbing layer 5 in the process of selenizing the precursor. Thus, according to the present invention, it is possible to fabricate a CIGS light absorbing layer 5 made of high quality P-type semiconductor of Cu(In+Ga) having higher homogeneity of crystals, eliminating the possibility of forming a different layer (Cu—Ga—se) being inferior and fragile in crystal structure and having conductivity at a boundary between the Mo electrode layer 2 and the light absorbing layer 5 and forming a different conductive film (Cu2Se) on the surface of the light absorbing layer 5. Namely, a solar cell having high quality storage property with no leak can be obtained, which is durable in construction and tight in adhesion of the light absorbing layer to the Mo electrode layer.

Figure 10:
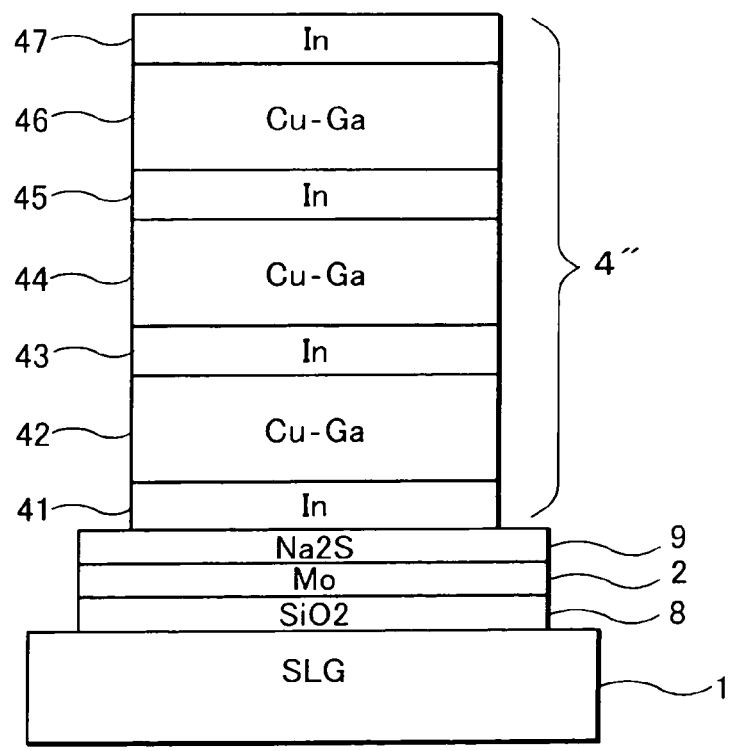
FIG. 10 is a front sectional view of a laminated precursor having a plurality of Cu—Ga layers each sandwiched between In layers, which are stacked in stages on an alkali layer.

FIG. 10 illustrates another laminated precursor 4" according to the present invention, which has a plurality of Cu—Ga layers each sandwiched between In layers and stacked in stages on a Mo electrode layer.

In the shown instance, a laminated precursor 4" of three-staged structure is fabricated by successively forming an In layer 41, a Cu—Ga alloy layer 42, an In layer 43, a Cu—Ga alloy layer 44, an In layer 45, a Cu—Ga alloy layer 46 and an In layer 43 in the described order on the Mo electrode layer 2.

The use of the precursor 4" having the bottom In-layer 41 on the Mo-electrode layer 2 and the top In-layer 47, in which the Cu—Ga alloy layer 42, the In layer 43, the Cu—Ga layer 44, the In layer 45 and the Cu—Ga alloy layer 46 are evenly arranged, can produce a CIGS light absorbing layer 5 of a high quality P-type semiconductor made of Cu(In+Ga) having higher homogeneity of crystals.

Figure 11:
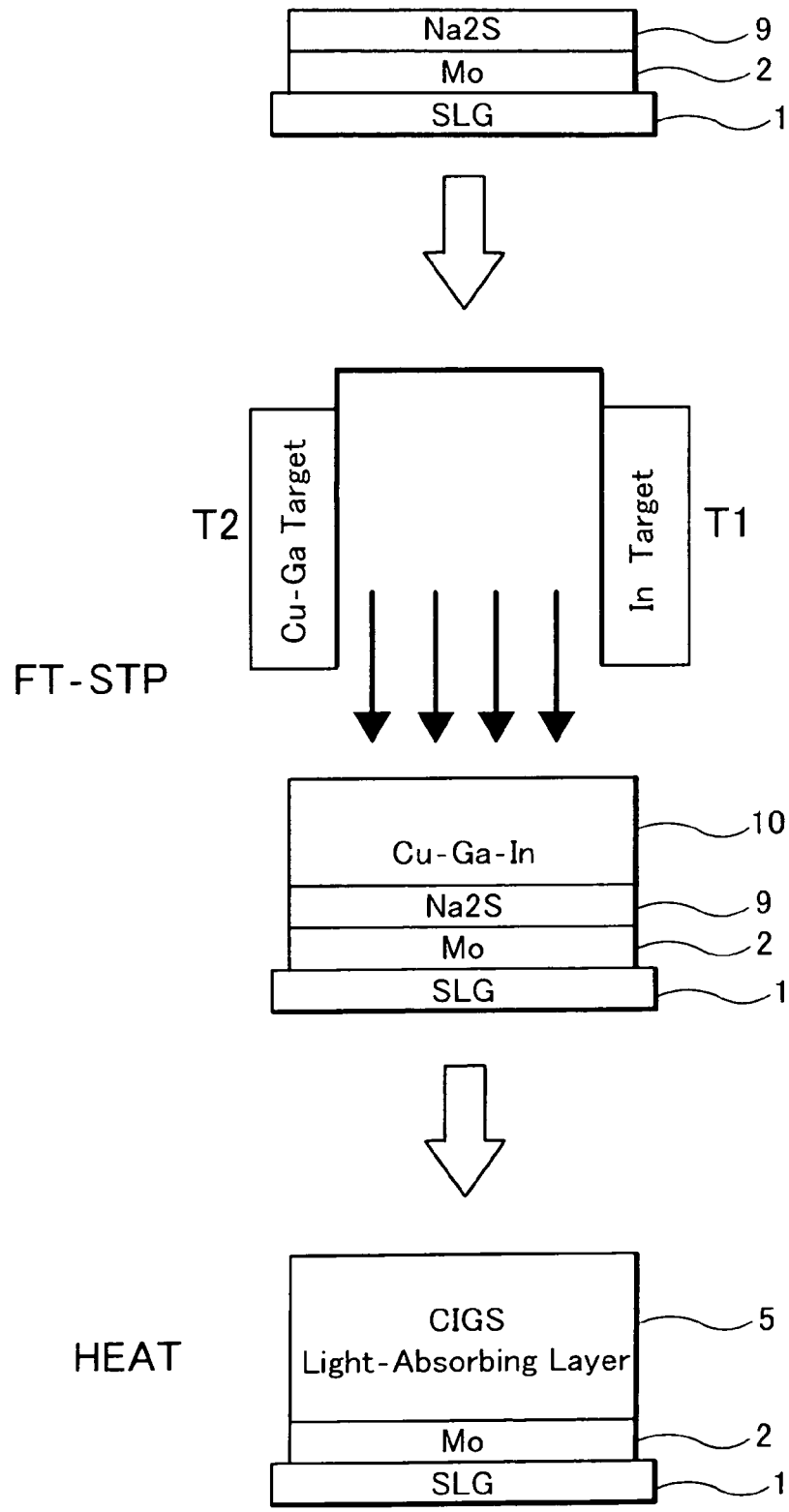
FIG. 11 illustrates a process of producing a light absorbing layer by forming a single-layered precursor film on an alkali layer according to the present invention.

FIG. 11 illustrates another process of producing a light absorbing layer according to the present invention, whereby a single-layered precursor film is formed by depositing a mixture of particles of Ib group metal element and IIIb group metal element supplied at the same time and then treated by heat in a selenium atmosphere to complete a light absorbing layer of CIGS for a thin film compound semiconductor solar cell.

Specifically, the process comprises a sputtering process FT-SPT of preparing a single-layered precursor film 10 on an alkali layer 9 formed in advance on a Mo-electrode layer 2 by depositing thereon a mixture of particles sputtered at the same time from a pair of a copper-gallium (Cu—Ga) target T1 and an indium (In) target T2, disposed opposite to each other, and a heat treatment process HEAT of treating by heat the precursor film deposited on the Mo layer of the SLG substrate 1 in a selenium atmosphere to complete the light absorbing layer 5 of CIGS.

Although the Mo electrode layer 2 in the shown case is formed directly on the SLG substrate 1, it is of course possible to provide between them a barrier layer to prevent the diffusion of Na from the substrate into the Mo electrode layer.

Figure 12:
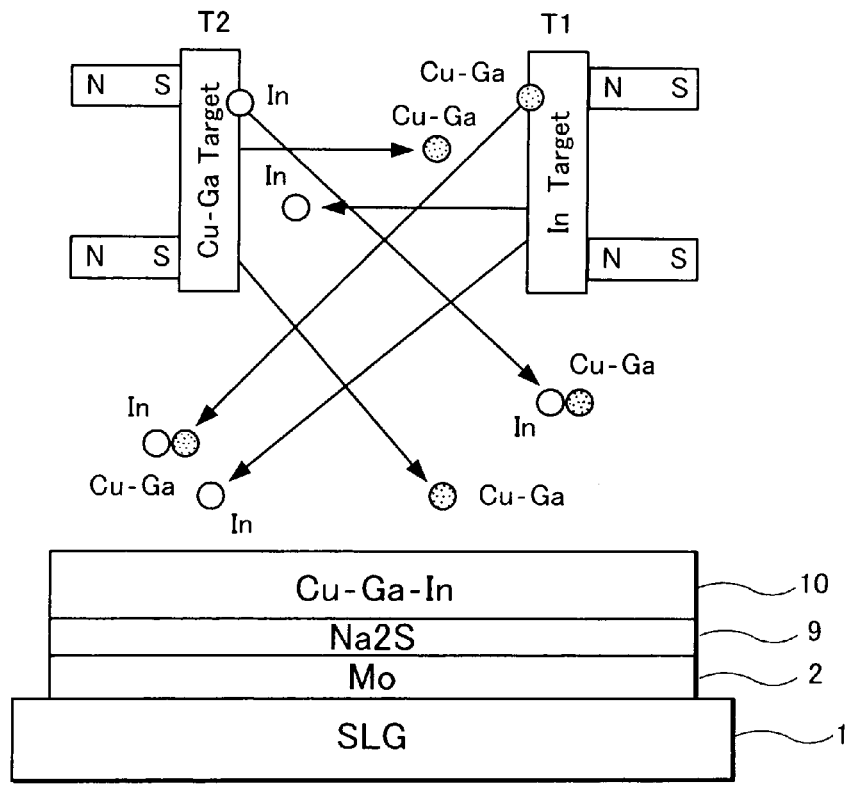
FIG. 12 illustrates a state of sputtered particles forming a single-layered precursor film by an opposite target type sputtering process.

FIG. 12 illustrates the state of particles sputtered from the Cu—Ga target T1 and the In target T2 when forming a precursor film 10 of mixed particles of Cu—Ga—In.

When the Cu—Ga target T1 and the In target T2 were simultaneously excited, particles are sputtered from the paired targets and reach the surfaces of the opposite targets. As a result, particles of three different metal elements Cu, Ga and In are mixed at the surface of each of the targets and then sputtered again therefrom and deposited onto the alkali layer 9 of the substrate. The precursor film 10 of Cu, Ga and In is thus formed.

In this instance, a part of the particles sputtered from each of targets T1 (Cu—Ga) and T2 (In) may not be directed to the opposite target and may be directly deposited on the substrate but in amounts very small because particles may be sputtered at such angles at a very small probability. Most particles of three kinds of metal elements (Cu, Ga and In) are deposited in well mixed state on the electrode layer formed on the substrate.

In other words, the metal precursor 10 obtained by the method according to the present invention is composed of well mixed particles Cu—Ga— In deposited in a single layer whereas the metal cursor obtained by the previously described method are laminated of a thin layer of Cu—Ga and a thin layer of In.

As compared with the laminated metal precursor, the metal precursor film 10 of the present invention is featured by higher uniformity of distribution therein of metal elements Cu, Ga and In, thereby preventing the progress of forming an alloy by diffusion of metal elements in solid layers. The precursor film 10 thus obtained can be evenly selenized by the heat treatment process.

Consequently, the precursor thus formed and treated by heat to form the light absorbing layer can also prevent the occurrence of a strange crystal layer (different from the crystal structure to be expected) in the thin film compound semiconductor solar cell (final product), which is one of causes of deterioration of the solar cell.

The metal precursor has a pseudo amorphous structure which is effective to achieve a high quality of a thin CIGS film of the light absorbing layer.

The metal precursor film 10 is an alloy composed of three metal elements, which can prevent the solar cell product from being short-circuited.

The above-described simultaneous sputtering of both targets T1 and T2 makes it possible to form the precursor film 10 at a high speed. The precursor thus formed in a single thin layer composed of three metals (Cu, Ga, In) uniformly distributed therein is then treated by heat in the presence of selenium (Se) to form a selenized thin-film of Cu(In+Ga) Se2, which is a light-absorbing layer (p-type semiconductor) 5 possessing a high quality. The light-absorbing layer 5 formed by selenizing the thus prepared precursor film 10 has been proved to show a photoelectric conversion efficiency exceeding 15%.

Figure 13:
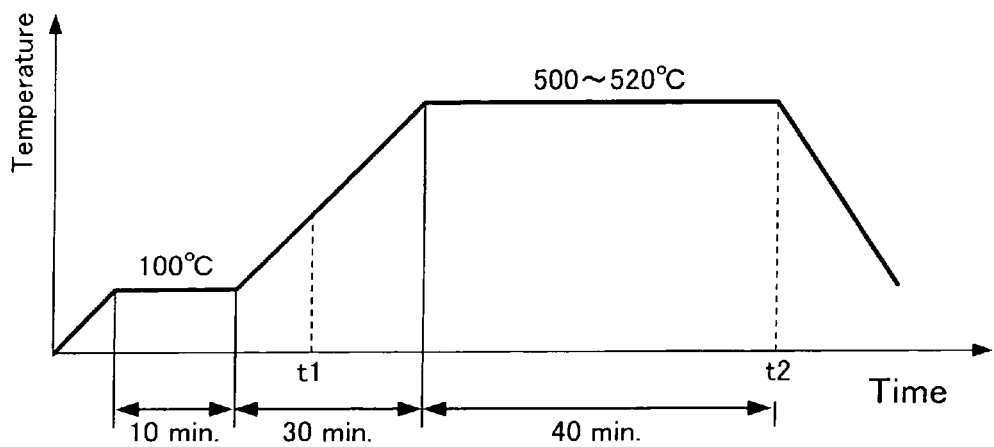
FIG. 13 illustrates an exemplary characteristic of heat-treatment of a precursor film in a selenium atmosphere to form a thin layer of CIGS according to the present invention.

FIG. 13 shows an example of a heating temperature characteristic of a furnace wherein the precursor film 10 (the laminated precursor 4) is treated by heat with H2Se gas (diluted with 5% argon gas) to form a CIGS thin film light-absorbing layer 5 by thermal chemical reaction with selenium (in gas phase).

The furnace is first heated up to 100° C. following by holding for 10 minutes for stabilizing the inside temperature of the furnace. The inside temperature is then increased gradually through a stable ramp-up period of about 30 minutes to 500~520° C. at which the soda-lime glass (SLG) substrate with a precursor formed thereon may not be deformed and can be heat-treated to obtain the high quality crystal structure of the precursor. In the above heating process, selenium (Se) produced by thermal decomposition of H2Se gas is supplied from the time t1 when the inside temperature of the furnace reached about 230~250° C. In order to attain the high crystal structure of the CIGS thin film by high temperature treatment, the precursor of the substrate is treated for 40 minutes maintaining the furnace inside temperature at 500 to 520° C. The furnace is charged with H2Se gas at a normal temperature from the time point when the inside temperature reached 100° C. The precursor is treated by heat at a constant inside pressure of the furnace. When the heat treatment of the precursor was completed at the time point t2, the furnace gas is replaced by argon gas at a low pressure of about 100 Pa to prevent further unnecessary deposition of selenium.

According to the present invention, when forming a precursor film 10 on a substrate by the opposite target type sputtering method, it is possible to use as paired opposite targets, not limited to a combination of Cu—Ga and In targets, other combinations of Cu—Ga or Cu—Al and In—Cu, Cu and In or Al, and Cu and In—Cu. Basically, it is possible to apply a combination of twos of three metal groups Ib-IIIb (alloy metal), Ib (metal) and IIIb (metal).

Figure 14:
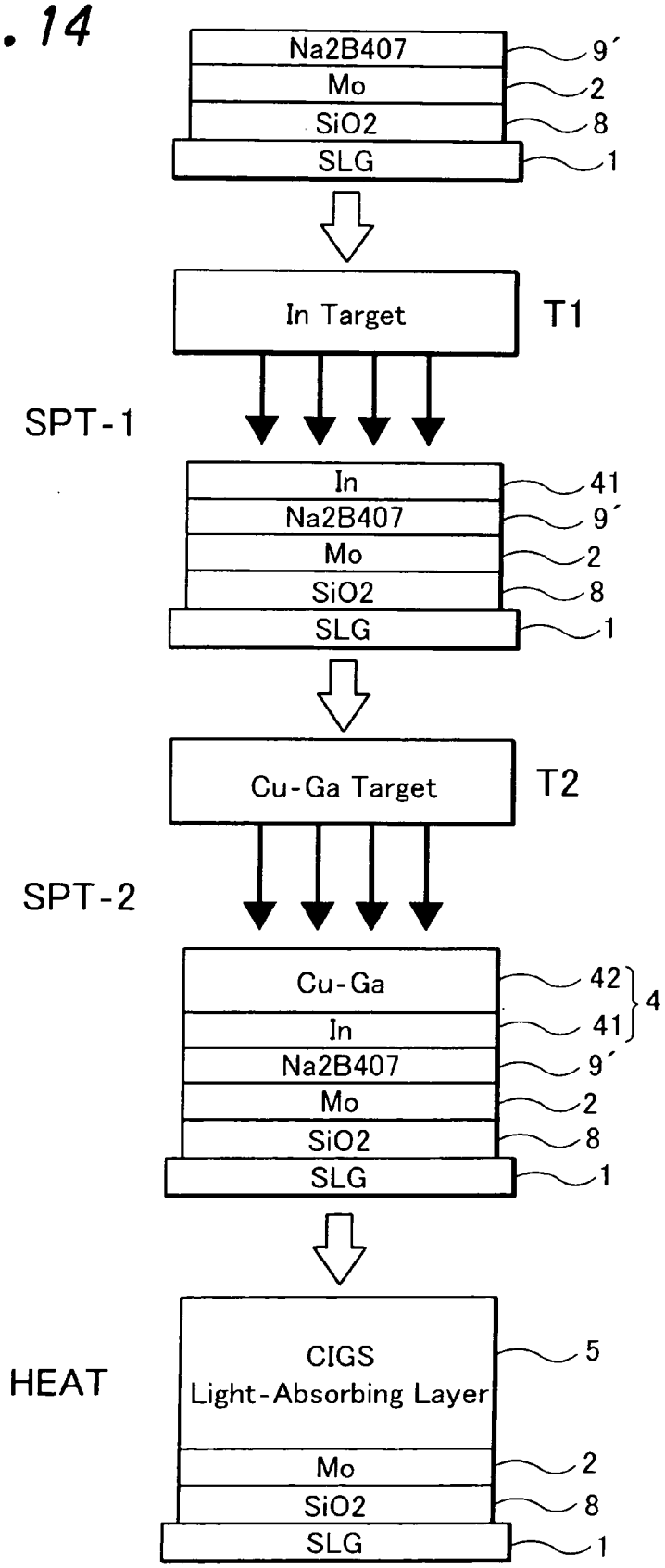
FIG. 14 illustrates a process of producing a light absorbing layer by using sodium tetraborate as an alkali layer.

According to the present invention, as shown in FIG. 14, an alkali layer 9' of chemical compound of Ia group element (Na) with IIIb group element (B, Al, Ca, In, Ti), e.g., sodium tetraborate (Na2B4O7), is formed by the dipping method on a Mo electrode layer 2 and then an In layer 41 and a Cu—Ga alloy layer 42 are successively formed to prepare a laminated precursor 4 on the alkali layer. The precursor 4 is heat-treated in the selenium (Se) atmosphere to produce a CIGS thin film light absorbing layer 5.

The alkali layer 9' is formed for example by dipping the Mo electrode layer 2 formed on the substrate in an aqueous solution prepared by dissolving in pure water Na2B4O7.10H2O (10 hydrate of sodium tetraborate) in a concentration in a range of 0.1 to 5 wt %. The dipped layer is spin-dried and treated by baking at 150° C. for 60 minutes in surrounding air for regulating the degree of moisture remaining in the film.

In the process of treating by heat the precursor 4 to complete the light absorbing layer 5, the alkali layer 9 disappears by diffusing its alkali components (Na) into the light absorbing layer 5.

In this instance, the alkali layer 9 can be formed by a simple process. Furthermore, the alkali film 9 formed by the wet treatment process on the Mo electrode layer 2 contains moisture and can be free from such troubles that a dry film formed by a dry process may absorb moisture from the surrounding air with the result of deterioration and peeling of the layer. The hydration enables the alkali film to keep moisture which content can be regulated by the baking treatment of the precursor. Thus, the formed film has excellent wettability.

The thin film CIGS light absorbing layer 5 produced with use of the alkali layer 9' of sodium tetraborate can achieve higher power conversion efficiency in comparison with the thin film CIGS light absorbing layer 5 produced with use alkali layers of sodium sulfide (Na2S). The improvement of power conversion efficiency is due much to improvement of characteristics of FF and Voc which may effect to reduce crystal defects. The reason why the sodium tetraborate in comparison with the sodium sulfide can more contribute to improvement of characteristics of the light absorbing layer may be as follows:

In case of the sodium sulfide, sulfur components may cause defects of Cu2S. These defects may occur by adding sulfur to the CIGS irrespective of growing method (MBE: Molecular Beam Epitaxy), resulting in decrease in the power conversion efficiency of the product.

In contrast, the sodium tetraborate can be applied as a highly concentrated aqueous solution for dipping treatment as compared with the sodium sulfide aqueous solution. The aqueous sodium sulfide solution of high concentration may cause peeling of the formed alkali layer while the aqueous sodium tetraborate solution of the same concentration may not cause peeling of the formed alkali layer. Hence, the use of the sodium tetraborate solution can improve the adhesion between the Mo electrode layer 2 and the CIGS thin film light absorbing layer 5, attaining the higher power conversion efficiency of the product layer 5.

We have carried out experiments with two kinds of light absorbing layers fabricated under the same conditions except for alkali layers, one formed with sodium sulfide and the other with sodium tetraborate, and measured power conversion efficiencies of respective layers.

The measurement results indicate that the power conversion efficiency of the light absorbing layers with the sodium sulfide layers is 2.0~5.5% and the power conversion efficiency of the light absorbing layers with the sodium tetraborate layers is 5.8~9.0.

Figure 15:
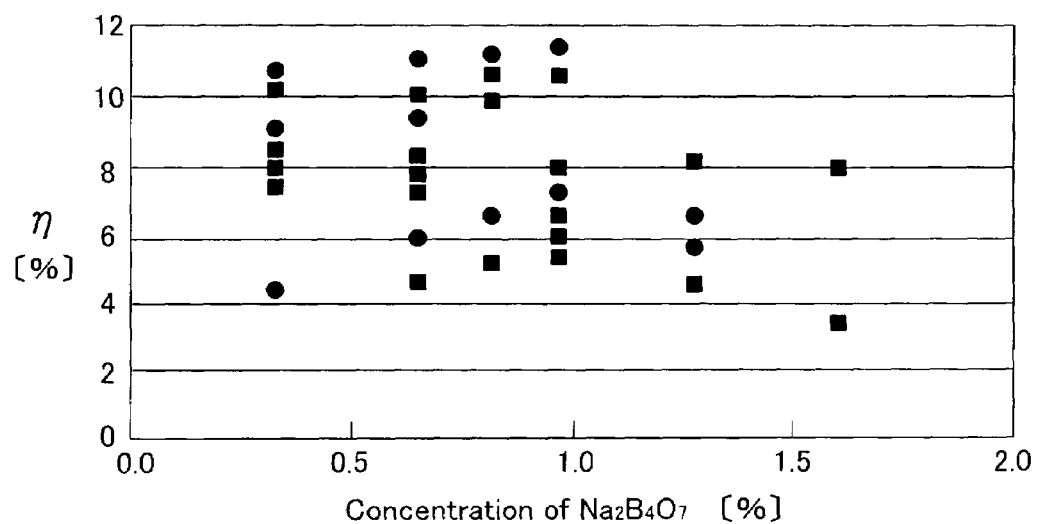
FIG. 15 is a graph showing a power conversion efficiency characteristic η of a product, which was measured with or without baking treatment after dipping by changing the sodium tetraborate concentration of the dipping solution.

FIG. 15 is a graph showing a power conversion efficiency characteristic of a product, which was measured with or without dehydration baking (at 150° C. for 60 minutes in air) after dipping by changing the sodium tetraborate concentration (wt. %) of dipping solution. In FIG. 15, • shows data of samples obtained without baking and ■ shows data of samples obtained with baking.

The experiment results indicate that the power conversion efficiency η have a peak at the dip concentration of 0.8 to 1.0% and decreases at the dip concentration exceeding the peak range, which decrease might be resulted from mottling occurred when the samples were spin-dried after dipping treatment. However, the samples dipped in the solution having such high concentrations were free from peeling of the layer at the boundary between the Mo electrode layer and the light absorbing layer. Experiment results indicate that the effect of dehydration baking treatment may improve variations in the power conversion efficiency η at the dip concentration of 1.0% or higher but does not achieve the best power conversion efficiency.

Based on the above data, we have adopted the dipping process using, as standard conditions, the aqueous solution of sodium tetraborate having the concentration of 0.8% without dehydration baking after dipping.

It is also possible to use, other than Na2B4O7.10H2O (Sodium tetraboro-10-hydrate), aqueous solutions of compounds of Ia group element and IIIb group element, for example:

NaAlO2: Sodium Alminate (This is not hydrate but hydrolysable);
NaBO3.4H2O: 4 hydrate of Sodium Perboric acid;
Na2B4O7: Sodium Tetraborate (anhydrous);
NaBD4: Sodium Borodeuteride;
C6H16BNa: Sodium Triethylborohydride;
C12B28BNa: Sodium Tri-sac-Butyl Borohydride;
NaBH4: Sodium Borohydride (Hydrolysable);
NaB(C6H5)4: Sodium Tetraphenyl Borate (Soluble in water);
NaBF4: Sodium Tetrafluoroborate (Soluble in water);
NaB(O2CCH3)3H: Sodium Triacetoxyborohydride;
Na(A1H2(OCH2CH2OCH3)2): Sodium Hydrobis(2-metoxy-etoxy) alminium (Soluble in toluene solution and hydrolysable);

AlNa(SO4)2.12H2O:Sodium Sulfate Alminium12-hydrate;

NaBF4: Sodium Borofluoride (Soluble in water).

Figure 16:
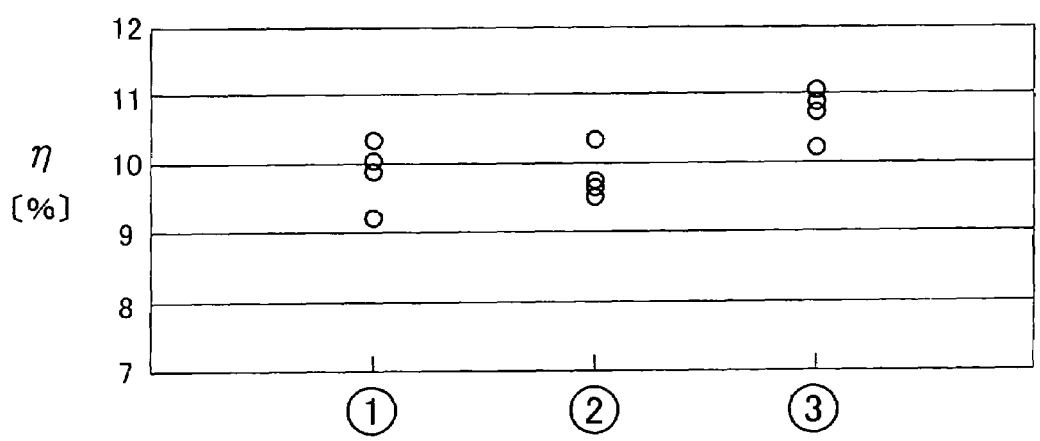
FIG. 16 is a graph showing a power conversion efficiency characteristic η of a product, which was obtained by the experiment by changing kinds of alkali metal used for the aqueous solution for forming an alkali layer by dipping method.

FIG. 16 is a graph showing power conversion efficiencies N of products, which were obtained by the experiments by changing kinds of alkali metals of aqueous dipping solutions for forming alkali layers by the dipping method.

Three kinds of alkali metals (alkali layer samples) were used:
1) Na2B4O7.10H2O (Sodium 4-bororate-10-hydrate), 0.80 w %.
2) K2B4O7.4H2O (Potassium 4-borate-4-hydrate), 0.80 w %.
3) Li2B4O7.3H2O (Lithium 4-borate-3-hydrate) 0.8 w %.

Experiments with each sample were conducted 4 times. There were variations in measured values for each sample. Dipping treatment was conducted on the surface of the Mo electrode layer.

The measurement results indicate that the best power conversion efficiency of the product was obtained with lithium sample (3). Variations in measured values were found but the same level improvements were recognized. It may be said that lithium sample (3) caused a relatively small quantity of dipped mottles whilst potassium sample (2) caused strong dipped mottles. The comparison of lithium sample (3) with sodium sample (1) indicates that lithium is smaller and has a larger coefficient of thermal diffusion in the CIGS crystal structure, thereby attaining the above described improvements of the effect of increasing grain diameter for duration of crystal growth and defects.

INDUSTRIAL APPLICABILITY

As is apparent from the foregoing, the light absorbing layer forming method according to the present invention can produce a thin-film CIGS light-absorbing layer by forming a thin-film precursor on a back electrode for a thin film compound solar cell (final product) and treated by heat in a selenium (Se) atmosphere, wherein the back electrode is dipped in an aqueous solution containing alkali metals and dried to form an alkali layer thereon and the precursor is then formed on the alkali layer. This method may easily form a layer of Ia-group alkali metal elements to be diffused in the light absorbing layer to improve the power conversion efficiency without causing peeling of the layer at the boundary of the back electrode layer. The application of this process to the production line of thin film solar cells makes it easier to fabricate solar cells which have durable structure and possess higher conversion efficiency.

What is claimed is:

1. A light absorbing layer producing method for fabricating a light absorbing layer of CIGS by forming a thin-film precursor on a back electrode layer of a compound semiconductor solar cell and by treating the formed precursor by heat in a selenium atmosphere, wherein an alkali layer is formed on the back electrode layer by dipping the back electrode in an aqueous solution containing alkali metals and drying the dipped surface and the precursor is then formed on the alkali layer and treated by heat in a selenium (Se) atmosphere.

2. A light absorbing layer producing method as defined in claim 1, wherein the aqueous solution is prepared by desolving a hydrate of a compound containing alkali metal.

3. A light absorbing layer producing method as defined in claim 1, wherein the aqueous solution contains alkali metal in a concentration range of 0.01 to 1.0%.

4. A light absorbing layer producing method as defined in claim 1, wherein the aqueous solution is prepared to have pH capable of removing by etching an oxide film from a surface of the back electrode layer.

5. A light absorbing layer producing method as defined in claim 4, wherein the pH of the aqueous solution is in a range of 11 to 13.

6. A light absorbing layer producing method as defined in claim 4, wherein a temperature of the aqueous solution is in a range of normal temperature to 70° C.

7. A light absorbing layer producing method as defined in claim 1, wherein the alkali layer is spin-dried and then baked for regulating moisture remaining therein.

8. A light absorbing layer producing method as defined in claim 6, wherein the alkali layer is treated by baking at a temperature of 100 to 350° C. for 10 to 60 minutes.

9. A light absorbing layer producing method as defined in claim 1, wherein between a glass substrate and the back electrode is provided a barrier layer for stopping diffusion of alkaline components of the glass substrate into the back electrode.

10. A light absorbing layer producing method as defined in claim 1, wherein a laminated precursor film composed of an indium (In) layer and a copper-gallium (Cu—Ga) alloy layer is formed on the alkali layer by sputtering from an indium (In) target and a copper-gallium (Cu—Ga) alloy target respectively.

11. A light absorbing layer producing method as defined in claim 10, wherein the laminated precursor film is formed by first forming an indium (In) layer on the alkali layer and then forming the copper-gallium (Cu—Ga) alloy layer on the indium (In) layer.

12. A light absorbing layer producing method as defined in claim 1, wherein a single layered indium-copper-gallium (In—Cu—Ga) alloy precursor film is formed on the alkali layer by opposite sputtering method using an indium (In) target and a copper-gallium (Cu—Ga) target arranged opposite to each other.

* * * * *